(12) United States Patent
Kido et al.

(10) Patent No.: US 6,597,012 B2
(45) Date of Patent: Jul. 22, 2003

(54) ORGANIC ELECTROLUMINESCENT DEVICE

(75) Inventors: Junji Kido, 9-4-3, Umamikita, Koryo-cho, Kitakatsuragi-gun, Nara (JP); Yoshiharu Sato, Yokohama (JP)

(73) Assignees: Junji Kido, Kitakatsuragi-gun (JP); Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 10/135,379

(22) Filed: May 1, 2002

(65) Prior Publication Data
US 2003/0006411 A1 Jan. 9, 2003

(30) Foreign Application Priority Data
May 2, 2001 (JP) ......................................... 2001-135274

(51) Int. Cl.[7] ........................... H01L 35/24; H01L 51/00
(52) U.S. Cl. ..................... 257/40; 257/98; 257/30; 428/690; 428/917; 428/704; 428/691
(58) Field of Search ................. 257/40, 98, 30; 428/690, 917, 704, 691; 313/506–507, 498; 252/301.16

(56) References Cited

U.S. PATENT DOCUMENTS

| | | | | |
|---|---|---|---|---|
| 3,180,730 A | * | 4/1965 | Klupfel et al. ............... 430/74 |
| 4,338,222 A | | 7/1982 | Limburg et al. |
| 4,950,950 A | * | 8/1990 | Perry et al. .................. 313/504 |
| 5,484,922 A | * | 1/1996 | Moore et al. ..................... 546/7 |
| 5,712,361 A | * | 1/1998 | Stern et al. .................... 528/86 |
| 5,908,581 A | * | 6/1999 | Chen et al. ............. 252/301.16 |
| 5,929,194 A | * | 7/1999 | Woo et al. .................... 528/229 |

(List continued on next page.)

FOREIGN PATENT DOCUMENTS

| | | |
|---|---|---|
| EP | 0 948 063 | 10/1999 |
| JP | 11-283750 | 10/1999 |

OTHER PUBLICATIONS

L. Li, et al., Organometallics, vol. 17, No. 18, pp. 3996–4003, "New Organo–Lewis Acids. Tris(β–Perfluoronaphthyl)Borane (PNB) as a Highly Active Cocatalyst for Metallocene–Mediated Ziegler–Natta α–Olefin Polymerization", 1998.

A. Yamamori, et al., Applied Physics Letters, vol. 72, No. 17, pp. 2147–2149, "Doped Organic Light Emitting Diodes Having a 650–NM–Thick Hole Transport Layer", Apr. 27, 1998.

R. H. Partridge, Polymer, vol. 24, pp. 733–738, "Electroluminescence from Polyvinylcarbazole Films: 1. Carbazole Cations", Jun. 1983.

*Primary Examiner*—Phat X. Cao
*Assistant Examiner*—Thao X. Le
(74) *Attorney, Agent, or Firm*—Oblon, Spivak, McClelland, Maier & Neustadt, PC

(57) ABSTRACT

An organic electroluminescent device having a luminescent layer interposed between an anode and a cathode, on a substrate, wherein a layer containing an electron-accepting compound containing a boron atom represented by the following formula (I):

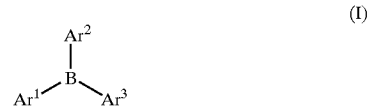

wherein each of $Ar^1$ to $Ar^3$ which are independent of one another, is an aromatic hydrocarbocyclic group or aromatic heterocyclic group which may have a substituent, and a hole transport compound, is formed between the luminescent layer and the anode.

18 Claims, 2 Drawing Sheets

7 : Cathode
6 : Electron transport layer
5 : Luminescent layer
4 : Hole transport layer
3 : Hole injection layer
2 : Anode
1 : Substrate

U.S. PATENT DOCUMENTS

| | | | |
|---|---|---|---|
| 6,121,727 A | | 9/2000 | Kanai et al. |
| 6,165,383 A | * | 12/2000 | Chou .................... 252/301.16 |
| 6,306,559 B1 | | 10/2001 | Tanamura et al. |
| 6,313,261 B1 | * | 11/2001 | Samuel et al. .............. 528/378 |
| 6,361,885 B1 | * | 3/2002 | Chou ......................... 428/690 |
| 6,368,731 B1 | * | 4/2002 | Heuer et al. ................. 428/690 |
| 6,391,482 B1 | * | 5/2002 | Matsuo et al. .............. 428/690 |
| 6,399,223 B1 | * | 6/2002 | Fujita et al. ................. 428/690 |
| 2001/0032665 A1 | * | 10/2001 | Han et al. ................... 136/256 |

* cited by examiner

- 7: Cathode
- 6: Electron transport layer
- 5: Luminescent layer
- 4: Hole transport layer
- 3: Hole injection layer
- 2: Anode
- 1: Substrate ——— HOMO
Electron-accepting compound

ORGANIC ELECTROLUMINESCENT DEVICE

BACKGROUND OF THE INVENTION

1. Field of the Invention

The present invention relates to an organic electroluminescent device. Particularly, it relates to a thin film type device which emits light when an electric field is applied to a luminescent layer comprising an organic compound.

2. Discussion of Background

Heretofore, it has been common that thin-film type electroluminescent (EL) devices are made of an inorganic material which is obtained by doping a semiconductor of a Group II–VI compound such as ZnS, CaS or SrS with Mn or a rare earth element (such as Eu, Ce, Tb or Sm) as the luminous center. However, the EL devices made of such inorganic materials, have the following problems:

1) Alternate current drive is required (usually from 50 to 1000 Hz),
2) The driving voltage is high (about 200 V),
3) It is difficult to obtain full coloring particularly blue color, and
4) Costs of peripheral driving circuits are high.

However, in order to overcome the above problems, there have been activities, in recent years, to develop EL devices using organic thin films. Particularly, the luminous efficiency has been improved to a large extent over conventional EL devices employing a single crystal of e.g. anthracene, by the development of an organic electroluminescent device wherein the electrode material has been optimized for the purpose of improving the efficiency for carrier injection from the electrode in order to increase the luminous efficiency, and a hole transport layer made of an aromatic diamine and a luminescent layer made of an aluminum complex of 8-hydroxyquinoline, are provided (Appl. Phys. Lett., vol. 51, p.913, 1987).

In addition to the above electroluminescent device employing a low molecular weight material, with regard to the material of a luminescent layer, an electroluminescent device employing a conjugated polymer material such as poly(p-phenylenevinylene), poly[2-methoxy-5-(2-ethylhexyloxy)-1,4-phenylenevinylene], poly(3-alkylthiophene) or polyfluorene, has been developed, and a device having a low molecular weight luminescent material and an electrontransport material mixed and dispersed in a polymer such as polyvinyl carbazole, has been developed.

Here, a critical issue in the organic electroluminescent device is decrease in the driving voltage. For example, a low voltage drive from a battery is required in a display device of a portable equipment, and even for general application other than portable equipment, the cost of a drive IC depends on the driving voltage, and the lower the driving voltage, the lower the cost.

Accordingly, in order to improve the contact between an anode and a hole transport layer, it has been studied to form a hole injection layer between the two layers to decrease the driving voltage. The material to be used for the hole injection layer is required to have good contact with the anode, to be able to form a uniform thin film, to be thermally stable i.e. to have a high melting point and a high glass transition temperature (Tg), preferably a melting point of at least 250° C. and a glass transition temperature of at least 85° C. Further, it is required that the ionization potential is low so that the hole injection from the anode is easy, and the hole mobility is large. Various materials for the hole injection layer have been studied, and e.g. porphine derivatives and phthalocyanine compounds (JP-A-63-295695), star burst type aromatic triamines (JP-A-4-308688), organic compounds such as polythienylenevinylene, polythiophene and polyaniline, sputtered carbon films and metal oxides such as vanadium oxide, ruthenium oxide and molybdenum oxide have been reported.

Further, a conjugated polymer having no electron-accepting compound mixed therewith is used for the hole injection layer in some cases (JP-A-4-145192), however, the driving voltage is so high that a luminance of from 3000 to 5000 $cd/m^2$ is obtained at a driving voltage of from 28 to 35V.

In order to overcome the above problems, it is attempted to mix a small amount of an electron-accepting compound with the hole transport compound. For example, it is disclosed that a low voltage drive can be achieved by mixing TBPAH (tris(4-bromophenyl)aminium hexachloroantimonate) as the electron-accepting compound with a non-conjugated hole transport polymer (JP-A-11-283750). However, TBPAH undergoes thermal decomposition during vapor deposition, and thus its addition to the hole injection layer by co-vapor deposition is inappropriate. Accordingly, it is usually mixed with a hole transport material by coating, however, since the compound has low solubility in a solvent, and it is not suitable for coating method. Further, this electron-accepting compound has a bromine atom, and such is considered problematic in view of long-term stability also.

Further, it is disclosed that the hole transport compound is doped with $FeCl_3$ as the electron-accepting compound by vacuum vapor deposition (JP-A-11-251067), however, this electron-accepting compound is corrosive, thus causing a damage over a vacuum deposition apparatus.

Such a high voltage at the time of driving and low stability including heat resistance of an organic electroluminescent device are serious problems as a light source of e.g. a facsimile, a copying machine or a back light of a liquid crystal display, and such are undesirable particularly as a display device of e.g. a full color flat panel display.

Further, indium tin oxide (ITO) which is commonly used as an anode in a conventional organic electroluminescent device has a surface roughness (Ra) at a level of 10 nm, and in-addition, it has protrusions locally in many cases, thus causing short-circuit defects at the time of device fabrication.

SUMMARY OF THE INVENTION

Under these circumstances, it is an object of the present invention to overcome the above conventional problems, and to provide an organic electroluminescent device which can be driven at a low voltage with a high luminous efficiency, which has a favorable heat resistance and which can maintain stable luminous properties over a long period of time.

Further, it is an object of the present invention to provide an organic electroluminescent device which can prevent short-circuit defects at the time of device fabrication resulting from the above-described surface roughness of the anode.

The organic electroluminescent device of the present invention, having an anode, a cathode and a luminescent layer interposed between the two electrodes on a substrate, is characterized by that a layer containing an electron-accepting compound containing a boron atom represented by the following formula (I) and a hole transport compound is formed between the luminescent layer and the anode:

wherein each of $Ar^1$ to $Ar^3$ which are independent of one another, is an aromatic hydrocarbocyclic group or aromatic heterocyclic group which may have a substituent.

Namely, the present inventors have conducted extensive studies to overcome the conventional problems and to provide an organic electroluminescent device capable of being driven at a low voltage, and as a result, they have found that the above problems can be overcome by forming, in an organic electroluminescent device having an anode, a cathode and a luminescent layer interposed between the two electrodes, on a substrate, a layer containing an electron-accepting compound containing a boron atom represented by the above formula (I) and a hole transport compound between the luminescent layer and the anode. The present invention has been accomplished on the basis of this discovery.

In the present invention, use of a hole transport compound and a specific electron-accepting compound together made it possible to improve the luminous properties and the heat resistance of the device simultaneously. Namely, by mixing the above specific electron-accepting compound containing boron with a hole transport compound, charge transfer takes place, and as a result, holes as free carriers are formed to increase the electric conductivity of the layer containing the compounds. By forming such a layer, electrical connection between the luminescent layer and the anode improves, the driving voltage decreases, and at the same time, stability at the time of continuous driving is improved. Further, particularly in a case where a hole transport compound having a glass transition temperature of at least 85° C. is used, the heat resistance of the device is significantly improved also.

Further, the electron-accepting compound containing boron represented by the above formula (I) used in the present invention has a high electron acceptability, and at the same time, has subliming properties, and it can thereby be used for layer formation by vacuum vapor deposition. Further, it has a high solubility in a solvent, and it can thereby be used for layer formation by a wet coating method, and the degree of freedom in the device design can be increased.

Here, the layer containing a hole transport compound and an electron-accepting compound according to the present invention is a layer having hole transport properties. It may be formed at any part so long as it is between the anode and the luminescent layer, and its formation is not limited to direct formation on the anode as illustrated in FIGS. 1 to 3. However, it is most advantageous to form the layer to be in contact with the anode so as to make adequate use of merits of this layer such as a good electrical connection with the anode (inorganic material) and a high heat resistance.

In such a case, by forming a layer containing a polymer material as the base on the anode by a coating process, such an effect is also obtained that the above-described surface roughness of the anode is decreased, a favorable surface smoothing effect can be obtained, and short-circuit defects at the time of device preparation can be prevented.

In the present invention, as the hole transport compound, the following are preferred:

(1) an aromatic tertiary amine compound or a compound having an aromatic tertiary amino group, preferably a compound containing an aromatic tertiary amino group and having a molecular weight of from 1,000 to 1,000,000, (2) a porphine derivative or a phthalocyanine derivative, or (3) a conjugated polymer.

In the present invention, the content of the electron-accepting compound in the layer containing the hole transport compound and the electron-accepting compound is preferably from 0.1 to 50 wt % based on the entire material forming the layer containing it.

BRIEF DESCRIPTION OF THE DRAWINGS

Now, the organic electroluminescent device of the present invention will be described with reference to the accompanying drawings.

DETAILED DESCRIPTION OF THE PREFERRED EMBODIMENTS

Figure 1:
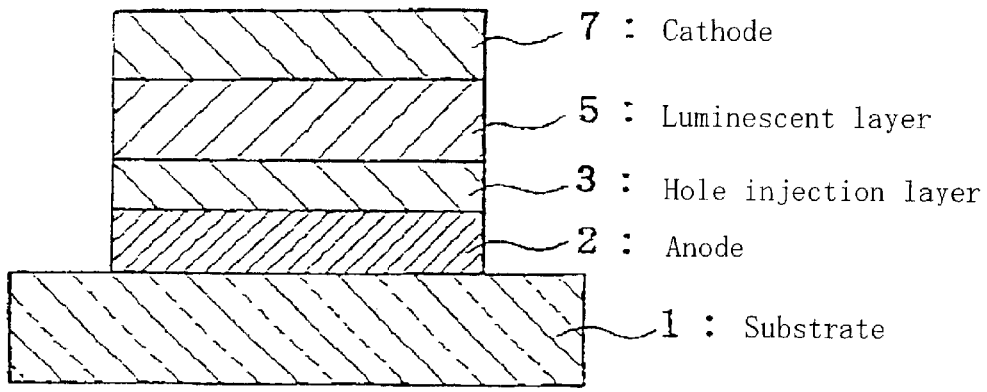
FIG. 1 is a schematic cross-sectional view illustrating an embodiment of the organic electroluminescent device of the present invention.
Figure 2:
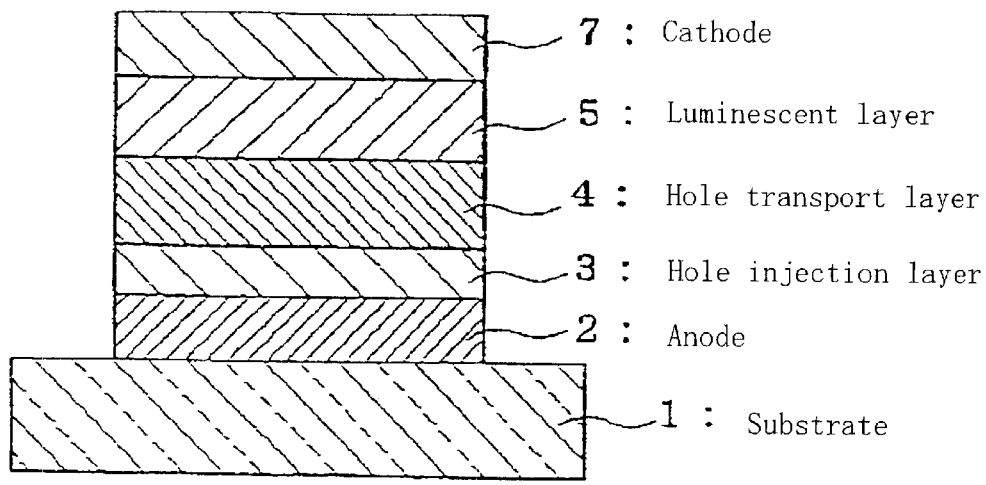
FIG. 2 is a schematic cross-sectional view illustrating another embodiment of the organic electroluminescent device of the present invention.
Figure 3:
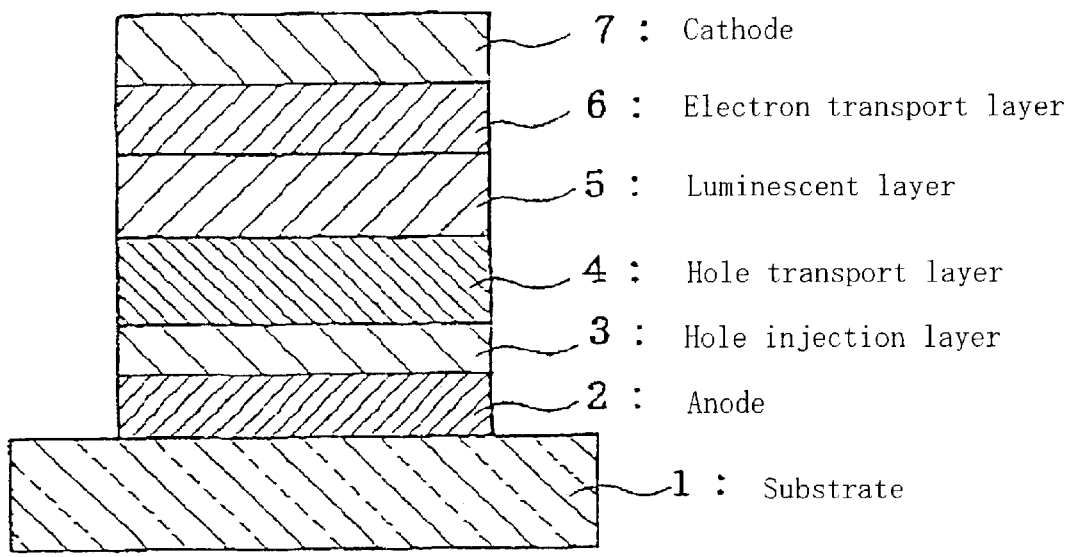
FIG. 3 is a schematic cross-sectional view illustrating still another embodiment of the organic electroluminescent device of the present invention.

Each of FIGS. 1 to 3 is a schematic cross-sectional view illustrating an embodiment of the organic electroluminescent device of the present invention, wherein reference numeral 1 indicates a substrate, numeral 2 an anode, numeral 3 a hole injection layer, numeral 4 a hole transport layer, 5 a luminescent layer, 6 an electrontransport layer and 7 a cathode.

The substrate 1 is a support for the organic electroluminescent device, and may, for example, be a quartz or glass sheet, a metal sheet or foil, or a plastic film or sheet. Particularly preferred is a glass sheet or a sheet of a transparent synthetic resin such as polyester, polymetacrylate, polycarbonate or polysulfone. When a synthetic resin substrate is used, it is necessary to pay an attention to a gas barrier property. If the gas barrier property of the substrate is too low, the organic electroluminescent device is likely to deteriorate due to an exterior gas which permeates the substrate, such being undesirable. Accordingly, it is one of preferred methods to provide a dense silicon oxide film on one side or each side of a synthetic resin substrate to secure the gas barrier property.

An anode 2 is formed on the substrate 1. The anode 2 plays a role of hole injection into a hole injection layer 3. This anode is made usually of a metal such as aluminum, gold, silver, nickel, palladium or platinum, a metal oxide such as indium and/or tin oxide, a metal halide such as copper iodide, or carbon black. Formation of the anode 2 is carried out usually by e.g. sputtering or vacuum vapor deposition, in many cases. Further, fine particles of a metal such as silver, fine particles of e.g. copper iodide, carbon black or fine particles of an electroconductive metal oxide may be dispersed in a suitable binder resin solution, followed by coating on the substrate 1 to form the anode 2. The anode 2 may be formed by laminating different materials.

The thickness of the anode 2 varies depending upon the required transparency. In a case where transparency is required, it is usually preferred that the transmittance of visible light is usually at least 60%, preferably at least 80%. In such a case, the thickness is usually from 10 to 1000 nm, preferably from 20 to 500 nm. In a case where it may be opaque, the anode 2 may be the same material as the substrate 1. Further, on the above described anode 2, a different electroconductive material may be laminated.

In the device structures of FIGS. 1 to 3, a hole injection layer 3 is formed on the anode 2. The material for the hole injection layer 3 is required to be a material which has high efficiency for injecting holes from the anode 2 and which is capable of efficiently transporting the injected holes. For this purpose, it is required that the ionization potential is small, transparency to visible light is high, yet, the hole mobility is large and excellent in stability, and impurities constituting traps are less likely to form during the production or during use. In addition to such general requirements, the device is further required to have a heat resistance of at least 85° C., when its application to a portable display is taken into account.

In the organic electroluminescent device of the present invention, this hole injection layer 3 is preferably the layer containing an electron-accepting compound containing a boron atom represented by the above formula (I) and a hole transport compound.

In the present invention, by use of a hole transport compound and a specific electron-accepting compound together made it possible to improve luminous properties of the device. Namely, by mixing the electron-accepting compound with the electron donative hole transport compound, charge transfer takes place, and as a result, holes as free carriers are formed to increase the electrical conductivity of the hole injection layer 3. Accordingly, by forming such a hole injection layer 3, electrical connection between the luminescent layer 5 and the anode 2 improves, the driving voltage decreases, and at the same time, the stability at the time of continuous driving also improves. Further, particularly by using a hole transport compound having a glass transition temperature of at least 85° C. as the base of the hole injection layer 3, heat resistance of the device significantly improves also. Accordingly, the glass transition temperature of the hole transport compound used in the present invention is preferably at least 85° C.

The compound represented by the above formula (I) is preferably a Lewis acid.

Further, the compound has an electron affinity of preferably at least 4 eV, more preferably at least 5 eV.

In the electron-accepting compound represented by the above formula (I), each of $Ar^1$ to $Ar^3$ which are independent of one another, is preferably a 5- or 6-membered monocyclic group which may have a substituent, such as a phenyl group, a naphthyl group, an anthryl group or a biphenyl group, or an aromatic hydrocarbocyclic group obtained by condensation and/or direct bonding of from two to three of these groups, or a 5- or 6-membered monocyclic group which may have a substituent, such as a thienyl group, a pyridyl group, a triazyl group, a pyrazyl group or a quinoxalyl group, or an aromatic heterocyclic group obtained by condensation and/or direct bonding of two or three of these groups, and the substituent may, for example, be a halogen atom such as a fluorine atom; a $C_{1-6}$ linear or branched alkyl group such as a methyl group or an ethyl group; an alkenyl group such as a vinyl group; a $C_{1-6}$ linear or branched alkoxycarbonyl group such as a methoxycarbonyl group or an ethoxycarbo-nyl group; a $C_{1-6}$ linear or branched alkoxy group such as a methoxy group or an ethoxy group; an aryloxy group such as a phenoxy group or a benzyloxy group; a dialkylamino group such as a dimethylamino group or a diethylamino group; an acyl group such as an acetyl group, a haloalkyl group such as a trifluoromethyl group or a cyano group. The substituent is particularly preferably a substituent showing a positive value of a Hammett constant ($\sigma_m$, $\sigma_p$) ("Lange's Handbook of Chemistry", McGraw-Hill, 14th Ed., Section 9).

The compound represented by the above formula (I) is more preferably a compound wherein at least one of $Ar^1$ and $Ar^3$ has a substituent which shows a positive value of a Hammett constant ($\sigma_m$ and/or $\sigma_p$), and particularly preferably a compound wherein each of $Ar^1$ and $Ar^3$ has a substituent which shows a positive value of a Hammett constant ($\sigma_m$ and/or $\sigma_p$). When the compound has such an electron donative substituent, the electron acceptability of the compound improves, such being favorable.

The following may be mentioned as specific examples of preferred electron-accepting compounds containing boron represented by the above formula (I), but the compound is not limited thereto.

(1)

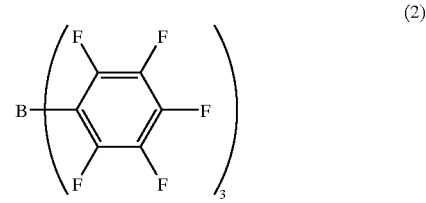

(2)

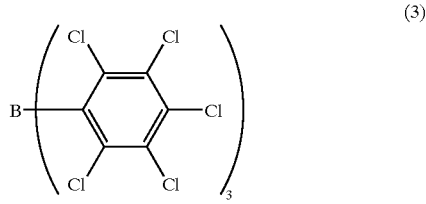

(3)

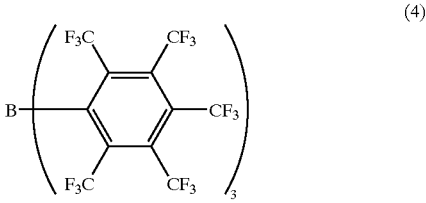

(4)

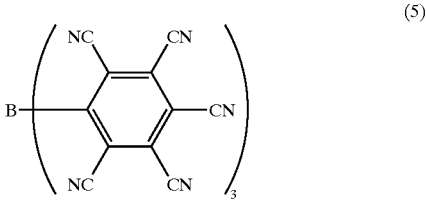

(5)

-continued $$\left( B - \underset{F}{\underset{|}{\bigcirc}} \right)_3 \quad (6)$$

$$\left( B - \underset{Cl}{\underset{|}{\bigcirc}}^{CN}_{CN} \right)_3 \quad (7)$$

$$\left( B - \underset{}{\bigcirc} - C \equiv C - H \right)_3 \quad (8)$$

$$\left( B - \underset{}{\bigcirc} - CN \right)_3 \quad (9)$$

$$\left( B - \underset{O_2N}{\underset{|}{\bigcirc}}^{O_2N}_{NO_2} \right)_3 \quad (10)$$

$$\left( B - \underset{}{\bigcirc}\!\!\!\begin{array}{c}C(O)CH_3\\C(O)CH_3\\C(O)CH_3\end{array} \right)_3 \quad (11)$$

$$\left( B - \underset{}{\bigcirc}\!\!\!\begin{array}{c}C(O)NH_2\\ \\C(O)NH_2\end{array} \right)_3 \quad (12)$$

$$\left( B - \underset{}{\bigcirc} - SCN \right)_3 \quad (13)$$

$$\left( B - \underset{}{\bigcirc} - S(O)_2CH_3 \right)_3 \quad (14)$$

-continued $$\left( B - \underset{}{\bigcirc} - S(O)_2NH_2 \right)_3 \quad (15)$$

$$\left( B - \underset{}{\text{(F}_6\text{-naphthyl)}} \right)_3 \quad (16)$$

$$\left( B - \underset{}{\text{((CN)}_6\text{-naphthyl)}} \right)_3 \quad (17)$$

$$\left( B - \underset{}{\text{((CF}_3)_6\text{-naphthyl)}} \right)_3 \quad (18)$$

$$\left( B - \underset{}{\text{(F}_8\text{-anthracenyl)}} \right)_3 \quad (19)$$

$$\left( B - \underset{}{\text{(4-pyridyl)}} \right)_3 \quad (20)$$

$$\left( B - \underset{}{\text{(pyrimidinyl)}} \right)_3 \quad (21)$$

$$\left( B - \underset{}{\text{(triazinyl)}} \right)_3 \quad (22)$$

-continued

(23) 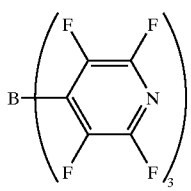

(24) 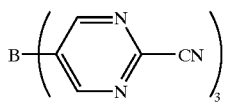

(25) 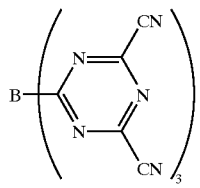

(26) 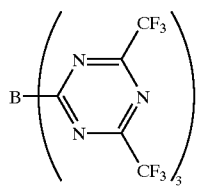

(27) 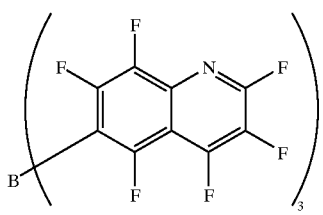

(28) 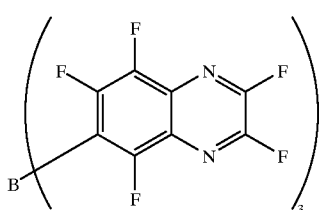

(29) 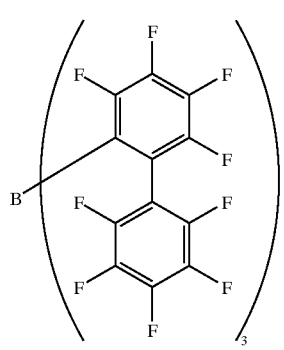

One type of the compound represented by the formula (I) may be used alone, or plural types of them may be used together. Further, a known electron-accepting compound may be used together within a range of not impairing the properties of the present invention.

The hole transport compound as a base with which the electron-accepting compound is mixed may be any material having a hole mobility of at least 0.0001 cm$^2$/V·sec.

As a material which satisfies such a purpose, one having an aromatic tertiary amine as a constitutional unit such as an aromatic tertiary amine compound or a compound having an aromatic tertiary amino group may be mentioned first. It may, for example, be an aromatic diamine compound containing at least two tertiary amino groups represented by 4,4'-bis[N-(1-naphthyl)-N-phenylamino]biphenyl and having at least two condensed aromatic rings substituted on a nitrogen atom (JP-A-5-234681), an aromatic tertiary amine compound which has a star burst structure such as 4,4',4"-tris(1-naphthylphenylamino)triphenylamine (J. Lumin., Vols. 72–74, P. 985, 1997), an aromatic tertiary amine compound consisting of a tetramer of triphenylamine (Chem. Commun., P. 2175, 1996) or a Spiro compound such as 2,2',7,7'-tetrakis-(diphenylamino)-9,9'-spirobifluorene (Synth. Metals, Vol. 91, P. 209, 1997). Further, a metal complex of a 8-hydroxyquinoline derivative having a diaryl amino group may also be mentioned (JP-A-11-204260). These compounds may be used alone or in combination as a mixture, as the care requires.

The hole transport compound is preferably a compound having an aromatic tertiary amino group having a molecular weight of from 1,000 to 1,000,000. Such a compound having an aromatic tertiary amino group may be a polymer compound containing an aromatic tertiary amino group as a constitutional unit in its main skeleton, and hole transport compounds having a structure represented by the following formula (II) or (III) as repeating units may be mentioned as specific examples:

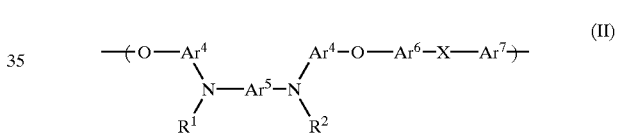

(II)

wherein each of Ar$^4$ to Ar$^7$ which are independent of one another, is a bivalent aromatic ring group which may have a substituent, each of R$^1$ and R$^2$ is a monovalent aromatic ring group which may have a substituent, and X is direct linkage or the following connecting group:

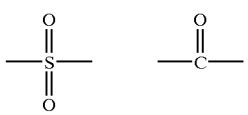

Here, in the present invention, the "aromatic ring group" includes both "a group derived from an aromatic hydrocarbocyclic ring" and "a group derived from an aromatic heterocyclic ring";

(III)

wherein Ar$^8$ is a bivalent aromatic ring group which may have a substituent, and Ar$^9$ is a monovalent aromatic ring group which may have a substituent.

In the above formula (II), each of Ar$^4$ to Ar$^7$ which are independent of one another, is preferably a bivalent benzene ring, naphthalene ring, anthracene ring or biphenyl which may have a substituent, and the substituent may, for example, be a halogen atom; a $C_{1-6}$ linear or branched alkyl group such as a methyl group or an ethyl group; an alkenyl group such as a vinyl group; a $C_{1-6}$ linear or branched alkoxycarbonyl group such as a methoxycarbonyl group or an ethoxycarbonyl group; a $C_{1-6}$ linear or branched alkoxy group such as a methoxy group or an ethoxy group; an aryloxy group such as a phenoxy group or a benzyloxy group; or a dialkylamino group such as a diethylamino group or a diisopropylamino group. The substituent is preferably a $C_{1-3}$ alkyl group, particularly preferably a methyl group.

Each of $R^1$ and $R^2$ which are independent of each other, is preferably a phenyl, naphthyl, anthryl, pyridyl, triazyl, pyrazyl, a quinoxalyl, thienyl or biphenyl group which may have a substituent, and the substituent may, for example, be a halogen atom; a $C_{1-6}$ linear or branched alkyl group such as a methyl group or an ethyl group; an alkenyl group such as a vinyl group; a $C_{1-6}$ linear or branched alkoxycarbonyl group such as a methoxycarbonyl group or an ethoxycarbonyl group; a $C_{1-6}$ linear or branched alkoxy group such as a methoxy group or an ethoxy group; an aryloxy group such as a phenoxy group or a benzyloxy group; or a dialkylamino group such as a diethylamino group or a diisopropylamino group.

The compound having the structure represented by the above formula (II) as repeating units may be synthesized, for example, by a pathway as disclosed by Kido et al. (Polymers for Advanced Technologies, Vol. 7, P. 31, 1996; JP-A-9-188756).

In the above formula (III), $Ar^8$ is a bivalent aromatic ring group which may have a substituent, preferably an aromatic hydrocarbocyclic group in view of hole transport properties, and specifically, a bivalent benzene ring, naphthalene ring, anthracene ring, biphenyl or terphenyl which may have a substituent may, for example, be mentioned, and the substituent may, for example, be a halogen atom; a $C_{1-6}$ linear or branched alkyl group such as a methyl group or an ethyl group; an alkenyl group such as a vinyl group; a $C_{1-6}$ linear or branched alkoxycarbonyl group such as a methoxycarbonyl group or an ethoxycarbonyl group; a $C_{1-6}$ linear or branched alkoxy group such as a methoxy group or an ethoxy group; an aryloxy group such as a phenoxy group or a benzyloxy group; a dialkylamino group such as a diethylamino group or a diisopropylamino group. The substituent is preferably a $C_{1-3}$ alkyl group, particularly preferably a methyl group.

$Ar^9$ is an aromatic ring group which may have a substituent, preferably an aromatic hydrocarbocyclic group in view of hole transport properties. Specifically, it may, for example, be a phenyl, naphthyl, anthryl, pyridyl, triazyl, pyrazyl, quinoxalyl, thienyl or biphenyl group which may have a substituent, and the substituent may, for example, be a halogen atom; a $C_{1-6}$ linear or branched alkyl group such as a methyl group or an ethyl group; an alkenyl group such as a vinyl group; a $C_{1-6}$ linear or branched alkoxycarbonyl group such as a methoxycarbonyl group or an ethoxycarbonyl group; a $C_{1-6}$ linear or branched alkoxy group such as a methoxy group or an ethoxy group; an aryloxy group such as a phenoxy group or a benzyloxy group; or a dialkylamino group such as a diethylamino group or a diisopropylamino group.

The compound having the structure as represented by the above formula (III) as repeating units may be synthesized, for example, by reacting the following materials in an organic solvent such as xylene in the presence of a palladium catalyst at 110° C. for 16 hours in accordance with the following reaction formula:

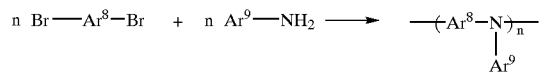

As a hole transport compound containing an aromatic tertiary amino group as a side chain, compounds having a structure represented by the following formula (IV) or (V) as repeating units may, for example, be mentioned:

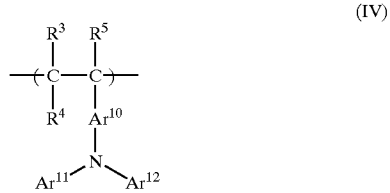

wherein $Ar^{10}$ is a bivalent aromatic ring group which may have a substituent, each of $Ar^{11}$ and $Ar^{12}$ which are independent of each other, is a monovalent aromatic ring group which may have a substituent, and each of $R^3$ to $R^5$ which are independent of one another, is a hydrogen atom, a halogen atom, an alkyl group, an alkoxy group or a monovalent aromatic ring group which may have a substituent;

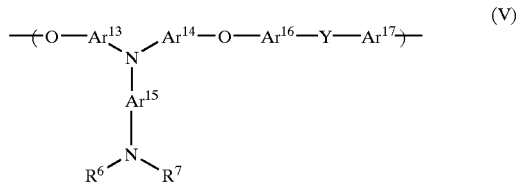

wherein each of $Ar^{13}$ to $Ar^{17}$ which are independent of one another, is a bivalent organic ring group which may have a substituent, each of $R^6$ and $R^7$ is an aromatic ring group which may have a substituent, and Y is direct linkage or the following connecting:

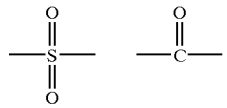

In the above formula (IV), $Ar^{10}$ is preferably a bivalent benzene ring, naphthalene ring, anthracene ring or biphenyl which may have a substituent, and the substituent may, for example, be a halogen atom; a $C_{1-6}$ linear or branched alkyl group such as a methyl group or an ethyl group; an alkenyl group such as a vinyl group; a $C_{1-6}$ linear or branched alkoxycarbonyl group such as a methoxycarbonyl group or an ethoxycarbonyl group; a $C_{1-6}$ linear or branched alkoxy group such as a methoxy group or an ethoxy group; an aryloxy group such as a phenoxy group or a benzyloxy group; or a dialkylamino group such as a diethylamino group or a diisopropylamino group, and it is preferably a $C_{1-3}$ alkyl group, particularly preferably a methyl group.

Each of $Ar^{11}$ and $Ar^{12}$ which are independent of each other, is preferably a phenyl, naphthyl, anthryl, pyridyl, triazyl, pyrazyl, quinoxalyl, thienyl or biphenyl group which may have a substituent. The substituent may, for example, be a halogen atom; a $C_{1-6}$ linear or branched alkyl group such as a methyl group or an ethyl group; an alkenyl group such as a vinyl group; a $C_{1-6}$ linear or branched alkoxycarbonyl group such as a methoxycarbonyl group or an ethoxycarbonyl group; a $C_{1-6}$ linear or branched alkoxy group such as a methoxy group or an ethoxy group; an aryloxy group such as a phenoxy group or a benzyloxy group; or a dialkylamino group such as a diethylamino group or a diisopropylamino group.

Each of $R^3$ to $R^5$ which are independent of one another, is preferably a hydrogen atom; a halogen atom; a $C_{1-6}$ linear or branched alkyl group such as a methyl group or an ethyl group; a $C_{1-6}$ linear or branched alkoxy group such as a methoxy group or an ethoxy group; a phenyl group; or a tolyl group.

The compound having the structure represented by the above formula (IV) as repeating units may be synthesized, for example, by a pathway as disclosed in JP-A-1-105954.

In the above general formula (V), each of $Ar^{13}$ to $Ar^{17}$ which are independent of one another, is preferably a bivalent benzene ring, naphthalene ring, anthracene ring or biphenyl which may have a substituent, and the substituent may, for example, be a halogen atom; a $C_{1-6}$ linear or branched alkyl group such as a methyl group or an ethyl group; an alkenyl group such as a vinyl group; a $C_{1-6}$ linear or branched alkoxycarbonyl group such as a methoxycarbonyl group or an ethoxycarbonyl group; a $C_{1-6}$ linear or branched alkoxy group such as a methoxy group or an ethoxy group; an aryloxy group such as a phenoxy group or a benzyloxy group; or a dialkylamino group such as a diethylamino group or a diisopropylamino group. The substituent is preferably a $C_{1-3}$ alkyl group, particularly preferably a methyl group.

Each of $R^6$ to $R^7$ which are independent of each other, is preferably a phenyl, naphthyl, anthryl, pyridyl, triazyl, pyrazyl, quinoxalyl, thienyl or biphenyl group which may have a substituent, and the substituent may, for example, be a halogen atom; a $C_{1-6}$ linear or branched alkyl group such as a methyl group or an ethyl group; an alkenyl group such as a vinyl group; a $C_{1-6}$ linear or branched alkoxycarbonyl group such as a methoxycarbonyl group or an ethoxycarbonyl group; a $C_{1-6}$ linear or branched alkoxy group such as a methoxy group or an ethoxy group; an aryloxy group such as a phenoxy group or a benzyloxy group; or a dialkylamino group such as a diethylamino group or a diisopropylamino group.

The compound represented by the above formula (V) may be synthesized, for example, by a pathway as disclosed by Kido et al. (Polymers for Advanced Technologies, Vol. 7, P. 31, 1996: JP-A-9-188756).

The following are preferred examples of the structures as represented by the above formulae (II) to (V), but the structures are not limited thereto.

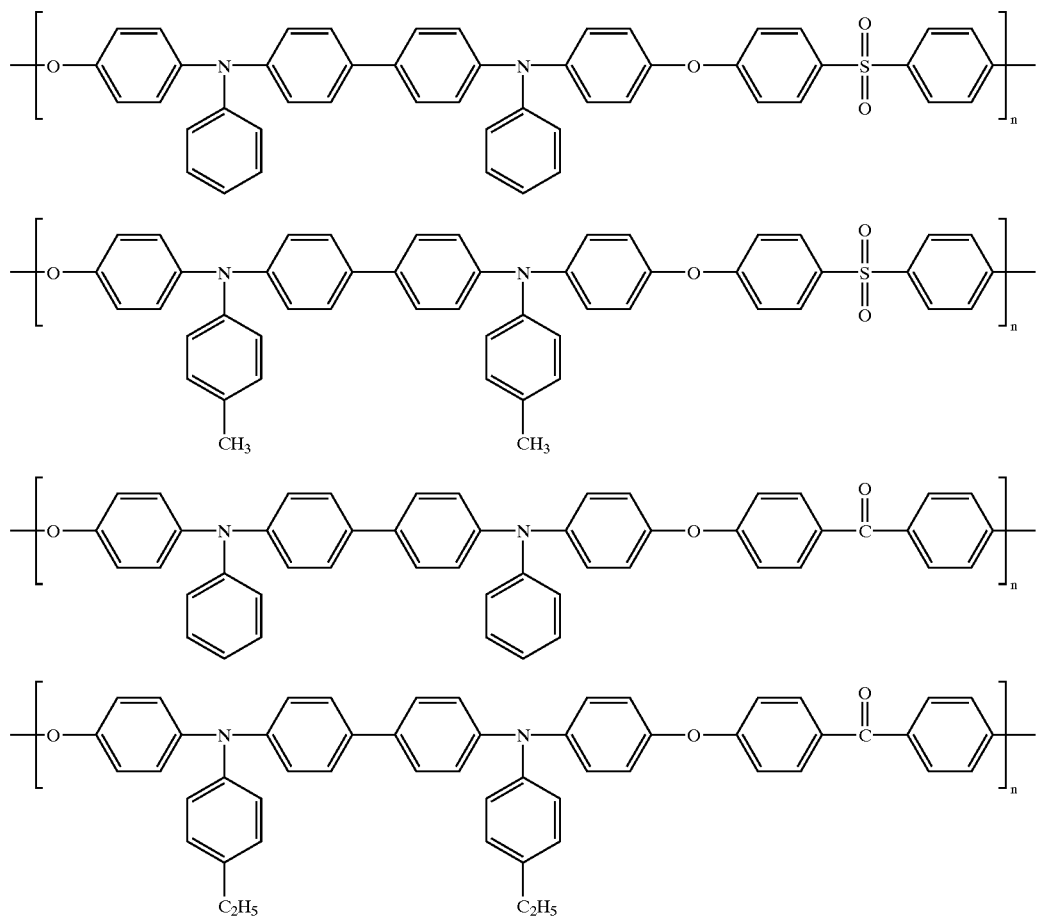

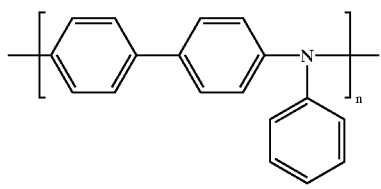
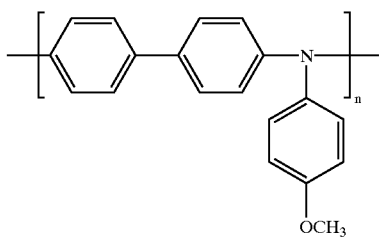
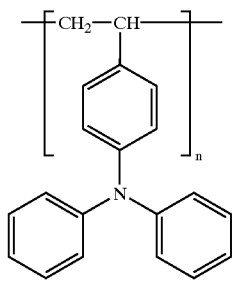
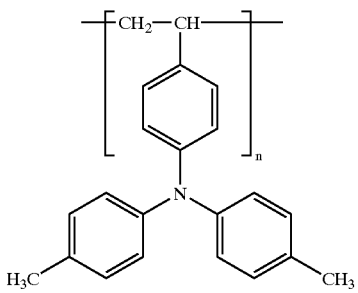

The hole transport compound according to the present invention is most preferably a homopolymer having a structure as represented by any one of the above formulae (II) to (V), however, it may be a copolymer with another optional monomer. In a case where the compound is a copolymer, it preferably contains at least 50 mol %, particularly preferably at least 70 mol % of the constitutional units as represented by any one of the above formulae (II) to (V).

Here, the hole transport compound according to the present invention may contain plural types of the structures represented by the above formulae (II) to (V).

Further, plural types of compounds containing the structures as represented by the above formulae (II) to (V) may be used together.

As the hole transport compound, a conjugated polymer may also be mentioned. For this purpose, polyfluorene, polypyrrole, polyaniline, polythiophene or polyparaphenylene vinylene is suitable.

In addition, a phthalocyanine derivative or a porphine derivative may be mentioned as the hole transport compound. The following compounds may be mentioned as specific examples of such preferred compounds:

Porphyrin
5,10,15,20-tetraphenyl-21H,23H-porphine
5,10,15,20-tetraphenyl-21H,23H-porphine cobalt(II),
5,10,15,20-tetraphenyl-21H,23H-porphine copper(II),
5,10,15,20-tetraphenyl-21H,23H-porphine zinc(II),
5,10,15,20-tetraphenyl-21H,23H-porphine vanadium(IV) oxide
5,10,15,20-tetra(4-pyrydyl)-21H,23H-porphine
29H,31H-phthalocyanine
Copper(II) phthalocyanine
Zinc (II) phthalocyanine
Titanium phthalocyanineoxide
Magnesium phthalocyanine
Lead phthalocyanine
Copper(II)4,4',4",4"'-tetraaza-29H,31H-phthalocyanine An oligothiophene derivative such as 6-T is also mentioned as another preferred hole transport compound.

In the present invention, among the above compounds, particularly preferred as the hole transport compound is an aromatic tertiary amine compound or a compound having an aromatic tertiary amino group, particularly a compound having a molecular weight of from 1,000 to 1,000,000.

The combination of the above-described hole transport compound and the electron-accepting compound of the present invention is not particularly limited so long as charge transfer takes place between the two compounds, however, it is particularly effective for the purpose of the present invention when two physical properties, the ionization potential of the hole transport compound IP(HTM) and the electron affinity of the electron-accepting compound (acceptor) EA (acceptor) satisfy the following relation:

IP(HTM)-EA(acceptor)≦0.7 eV

Figure 4:
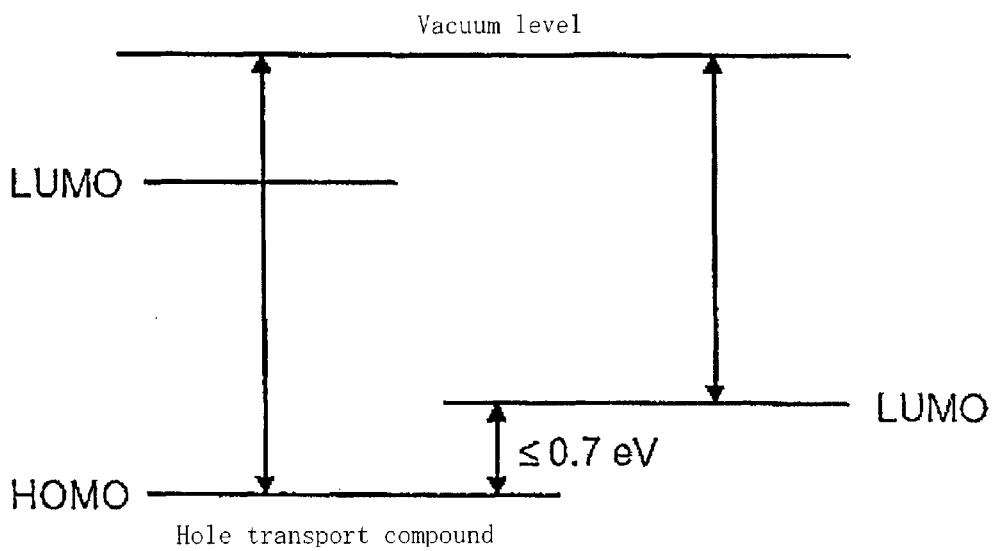
FIG. 4 is a diagram illustrating the energy level, which explains the relation between the ionization potential and the electron affinity.

This will be explained in accordance with FIG. 4 illustrating the energy level.

Usually, the ionization potential and the electron affinity are determined based on the vacuum level. The ionization potential is defined as an energy required to excite an electron at a HOMO (highest occupied molecular orbital) level of a substance to the vacuum level, and the electron affinity is defined as an energy released when an electron at the vacuum level drops to a LUMO (lowest unoccupied molecular orbital) level of a substance and stabilizes. The difference between the ionization potential of the hole transport compound at the HOMO level and the electron affinity of the electron-accepting compound at the LUMO level as shown in FIG. 4 is preferably at most 0.7 eV. The ionization potential may be directly measured by photoelectron spectroscopy, or obtained by correcting the electrochemically measured oxidation potential based on the reference electrode. In the case of the latter method, when a saturated calomel electrode (SCE) is used as the reference electrode for example, the ionization potential is represented by the formula: (ionization potential)=(oxidation potential) (vs.SCE)+4.3 eV ("Molecular Semiconductors", Springer-Verlag, 1985, P. 98). The electron affinity is obtained by subtracting the optical bandgap from the above-described ionization potential or from the electrochemical reduction potential simultaneously from the above formula.

The relational between the ionization potential and the electron affinity can be represented by using the oxidation potential and the reduction potential by the formula:

(oxidation potential of the polymer)−(reduction potential of the acceptor)≦0.7V

The layer containing the electron-accepting compound containing a boron atom represented by the above formula (I) and the hole transport compound, which is a characteristic of the present invention, may contain a binder resin or an additive as mentioned hereinafter, however, it preferably consists essentially of the electron-accepting compound and the hole transport compound.

The content of the electron-accepting compound in such a hole injection layer 3 is preferably within a range of from 0.1 to 50 wt %. The "preferred content" applies to a case where the layer is formed as a layer other than the "hole injection layer" in the device.

The hole injection layer 3 containing the hole transport compound and the electron-accepting compound containing a boron atom represented by the above formula (I) is formed on the anode 2 by coating or vacuum vapor deposition in a case where these compounds are low molecular weight compounds, or by coating in a case of high polymer compounds.

Namely, as described above, the electron-accepting compound containing boron represented by the above formula (I) has a high electron acceptability, and in addition, has subliming properties and is soluble in an appropriate solvent, and accordingly it can be applied to layer formation by vacuum vapor deposition and layer formation by wet coating.

In the case of layer formation by vacuum vapor deposition, the hole transport compound and the electron-accepting compound are put in separate crucibles set in a vacuum chamber, and the interior of the vacuum chamber is evacuated by a suitable vacuum pump to a level of about $10^{-4}$ Pa and then the respective crucibles are heated to evaporate the hole transport compound and the electron-accepting compound while independently controlling the evaporation amounts and thereby to form a layer on the anode 2 on the substrate placed face to face against the crucibles.

In the case of layer formation by coating, predetermined amounts of the hole transport compound and the electron-accepting compound, and as the case requires, a binder resin which is free from hole traps, or an additive such as an agent for improving the coating property, are added and dissolved in an appropriate solvent to prepare a coating solution, which is coated on the anode 2 by a method such as spin coating or dip coating, followed by drying to form the hole injection layer 3.

The thickness of the hole injection layer 3 is usually from 5 to 1,000 nm, preferably from 10 to 500 nm.

On the hole injection layer 3, a luminescent layer 5 is formed. The luminescent layer 5 is made of a material which is capable of efficiently recombining electrons injected from the cathode and holes transported from the hole injection layer 3 between electrodes to which an electric field is imparted, and efficiently emitting light by recombination.

The material which satisfies such conditions may, for example, be a metal complex such as an aluminum complex of 8-hydroquinoline (JP-A-59-194393), a metal complex of 10-hydroxybenzo[h]quinoline (JP-A-6-322362), a bisstyrylbenzene derivative (JP-A-1-245087, JP-A-2-222484), a bisstyryl arylene derivative (JP-A-2-247278), a metal complex of (2-hydroxyphenyl)benzothiazol, or a silol derivative. Such a luminescent layer material is usually laminated on the hole injection layer 3 by vacuum vapor deposition.

For the purpose of changing the luminescent color at the same time as improving the luminous efficiency of the device, it has been proposed to dope a fluorescent dye for laser, such as coumarin, using e.g. an aluminum complex of 8-hydroxyquinoline as the host material (J. Appl. Phys., Vol. 65, P. 3610, 1989).

Also for the purpose of improving the driving life of the device, it is effective to dope a fluorescent dye using the above luminescent material as the host material. For example, it is possible to substantially improve the luminescent characteristic, particularly the driving stability, of the device by doping from 0.1 to 10 wt %, based on the host material, of a naphthacene derivative represented by rubrene (JP-A-4-335087), a quinacridone derivative (JP-A-5-70773) or a condensed polycyclic aromatic ring such as perylene (JP-A-5-198377), using a metal complex such as an aluminum complex of 8-hydroxyquinoline as the host material. As a method of doping the host material of the fluorescent layer with the fluorescent dye such as a naphthacene derivative, a quinacridone derivative or perylene, a method by co-vapor deposition and a method of preliminarily mixing a vapor deposition source at a predetermined concentration may be mentioned.

The luminescent layer material of polymer type, the above-described polymer material such as poly(p-phenylene vinylene), poly[2-methoxy-5-(2-ethylhexyloxy)-1,4-phenylene vinylene] or poly(3-alkylthiophene), or a system obtained by mixing a luminescent material and an electron-transport material with a polymer such as polyvinyl carbazole, may, for example, be mentioned. Such a material is coated on the hole injection layer 3 by a method such as spin coating or dip coating in the same manner as the hole injection layer 3, to form a thin film.

The thickness of the luminescent layer 5 thus formed is usually from 10 to 200 nm, preferably from 30 to 100 nm.

In order to improve luminous properties of the device, the hole transport layer 4 may be formed between the hole injection layer 3 and the luminescent layer 5 as shown in FIGS. 2 and 3, or the electrontransport layer 6 may be formed between the luminescent layer 5 and the cathode 7 as shown in FIG. 3, to form a function separation type.

In the function separation type device as shown in FIGS. 2 and 3, the material of the hole transport layer 4 is required to be a material which has a high hole injection efficiency from the hole injection layer 3, and is capable of efficiently transporting injected holes. For this purpose, it is required that the ionization potential is small, the hole mobility is large and excellent in stability, and impurities constituting traps are less likely to form during the production or during use. Further, it is required to contain no substance which eliminates light emission since the hole transport layer is a layer to be in direct contact with the luminescent layer 5.

Such a hole transport material may, for example, be an aromatic diamine containing at least two tertiary amines represented by 4,4'-bis[N-(1-naphthyl)-N-phenylamino] biphenyl and having at least two condensed aromatic rings substituted on a nitrogen atom (JP-A-5-234681), an aromatic amine compound having a star burst structure such as 4,4',4"-tris(1-naphthylphenylamino) triphenylamine (J. Lumin., Vols. 72–74, P. 985, 1997), an aromatic amine compound consisting of tetramers of triphenylamine (Chem. Commun., P. 2175, 1996), a spiro compound such as 2,2', 7,7'-tetrakis-(diphenylamino)-9,9'-spirobifluorene (Synth. Metals, Vol. 91, P. 209, 1997). These compounds may be used alone or in combination as a mixture as the case requires.

In addition to the above compounds, as the material for the hole transport layer 4, a polymer material such as a polyvinyl carbazole or polyvinyl triphenylamine (JP-A-7-53953) or a polyarylene ether sulfone containing tetraphenyl benzidine (Polym. Adv. Tech., Vol. 7, P. 33, 1996) may, for example, be mentioned.

The hole transport layer 4 is laminated on the hole injection layer 3 by coating or vacuum vapor deposition.

In the case of coating, one or more hole transport materials and, if necessary, a binder resin which is free from hole traps, or an additive such as an agent for improving the coating property, are added and dissolved to obtain a coating solution, which is then coated on the hole injection layer 3 by the method such as spin coating, followed by drying to form a hole transport layer 4. The binder resin may, for example, be polycarbonate, polyacrylate or polyester. The amount of the binder resin should better be small, and usually preferably at most 50 wt %, since if the amount is large, the hole mobility tends to be low.

In the case of the vacuum vapor deposition, the hole transport material is put in a crucible set in a vacuum chamber, and the interior of the vacuum chamber is evacuated by a suitable vacuum pump to a level of about $10^{-4}$ Pa, and then the crucible is heated to evaporate the hole transport material and thereby to form a hole transport layer 4 on the substrate 1 having an anode 2 and the hole injection layer 3 formed thereon, placed face to face against the crucible.

The thickness of the hole transport layer 4 thus formed is usually from 10 to 300 nm, preferably from 30 to 100 nm. To form such a thin film uniformly, it is usually common to employ vacuum vapor deposition.

As a method for further improving the luminous efficiency of the organic electroluminescent device, an electrontransport layer 6 may further be laminated on the luminescent layer 4 as illustrated in FIG. 3. The compound to be used for this electrontransport layer 6 is required to be such that electron injection from the cathode 7 is easy, and the ability of transporting electrons is larger. As such an electrontransport material, an aluminum complex of 8-hydroxyquinoline or an oxadiazole derivative, which has already been mentioned as a material for the luminescent layer (Appl. Phys. Lett., Vol. 55, P. 1489, 1989), a system having such a material dispersed in a resin such as poly (methylmethacrylate) (PMMA), a phenanethroline derivative (JP-A-5-331459), 2-t-butyl-9,10-N,N'-dicyanoanthraquinonediimine, n-type hydrogenated amorphous silicon carbide, n-type zinc sulfide or n-type zinc selenide, may, for example, be mentioned.

The thickness of such an electrontransport layer 6 is usually from 5 to 200 nm, preferably from 10 to 100 nm.

The cathode 7 performs a role of injecting electrons to the luminescent layer 5. As the material to be used as the cathode 7, a material to be used for the above anode 2 may be used, however, for efficient electron injection, a metal having a low work function is preferred, and a suitable metal such as tin, magnesium, indium, calcium, aluminum or silver or an alloy thereof may be used. As specific examples, low-work function alloy electrodes such as a magnesium-silver alloy, a magnesium-indium alloy and an aluminum-lithium alloy may be mentioned.

The thickness of the cathode 7 is usually the same as the anode 2. For the purpose of protecting the cathode consisting of a low-work function metal, it is effective to further laminate on the cathode a metal layer which has a high work function and which is stable over the air, in order to increase the stability of the device. For this purpose, a metal such as aluminum, silver, copper, nickel, chromium, gold or platinum may be used.

Further, insertion of an extremely thin insulating film (film thickness: 0.1–5 nm) of e.g. LiF, $MgF_2$, $Li_2O$ in an interface between the cathode 7 and the luminescent layer 5 or the electrontransport layer 6, is also effective for improving the efficiency of the device (Appl. Phys. Lett., Vol. 70, P. 152, 1997: JP-A-10-74586, IEEE Trans. Electron. Devices, Vol. 44, P. 1245, 1997).

Each of FIGS. 1 to 3 illustrates one example of the device structure employed in the present invention, and the present invention is by no means restricted to such specific Figures. For example, a structure opposite to FIG. 1 may be mentioned, that is, it is possible to laminate on a substrate 1, a cathode 7, a luminescent layer 5, a hole injection layer 3 and an anode 2 in this order, and further, it is also possible to form the organic electroluminescent device of the present invention between two substrates, at least one of which has a high transparency, as described above. Similarly, with respect to FIGS. 2 and 3, it is possible to laminate the constituting layers in the order opposite to that in each FIG. Further, between layers, an optional layer other than the above-described layers may be formed.

Now, the present invention will be described in further detail with reference to Examples and Comparative Examples. However, it should be understood that the present invention is by no means restricted to such specific Examples.

EXAMPLE 1

An organic electroluminescent device having a structure shown in FIG. 2 was prepared by the following method.

A glass substrate having a transparent electro-conductive film of indium-tin oxide (ITO) coated with a thickness of 120 nm thereon (sheet resistance 15Ω), was subjected to pattering to form a stripe having a width of 2 mm by means of a conventional photolithographic technique and etching with hydrochloric acid, to form an anode 2. The pattern-formed ITO substrate was washed sequentially in the order of supersonic washing with acetone, washing with pure water and supersonic washing with isopropyl alcohol, then dried by blowing nitrogen and finally subjected to ultraviolet ray ozone cleaning.

A mixture comprising a polymer consisting of structural units having the following structure alone:

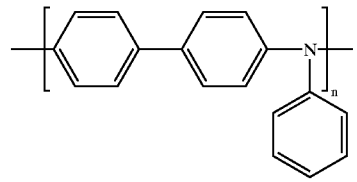

(Tg: 212° C., weight average molecular weight: 4000, homopolymer) and the above electron-accepting compound (2) (proportion of the electron-accepting compound (2) in the mixture was 40 wt % ) was spin-coated on the above ITO glass substrate with chloroform as a solvent.

By this spin coating, a hole injection layer 3 having a uniform film thickness of 20 nm was formed.

Then, the substrate 1 having the above hole injection layer 3 formed thereon was placed in a vacuum vapor deposition apparatus. The above apparatus was preliminarily evacuated by an oil-sealed rotary vacuum pump and then evacuated by an oil diffusion pump equipped with a liquid nitrogen trap until the vacuum degree in the apparatus became not higher than $2 \times 10^{-6}$ Torr (about $2.7 \times 10^{-4}$ Pa). An aromatic amine compound 4,4'-bis[N-(1-naphthyl)-N-phenylamino] biphenyl represented by the following structural formula:

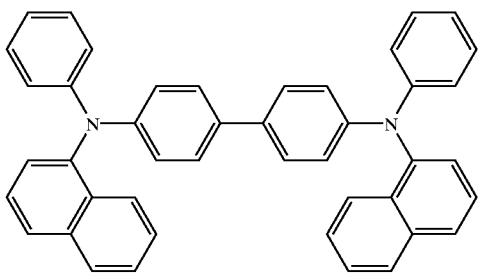

was put in a ceramic crucible placed in the above apparatus, and heated to carry out vapor deposition. During the vapor deposition, the vacuum degree was $2.0 \times 10^{-6}$ Torr (about $2.7 \times 10^{-4}$ Pa), and a film having a thickness of 20 nm was laminated on the hole injection layer 3 at a vapor deposition rate of 0.3 nm/sec to prepare a hole transport layer 4.

Then, as a material for the luminescent layer 5, a 8-hydroxyquinoline complex of aluminum $Al(C_9H_6NO)_3$ represented by the following structured formula:

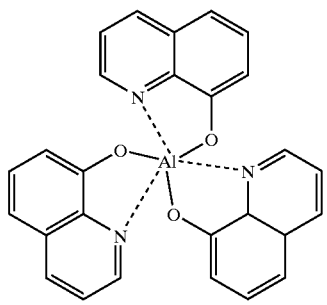

was vapor-deposited in the same manner as in the case of the hole transport layer 4. At that time, the crucible temperature of the 8-hydroxyquinoline complex of aluminum was controlled within a range of from 265 to 275° C. During the vapor deposition, the vacuum degree was $1.5 \times 10^{-6}$ Torr (about $2.0 \times 10^{-4}$ Pa), the vapor deposition rate was from 0.5 nm/sec, and the thickness of the vapor deposited luminescent layer was 70 nm.

The substrate temperature was maintained at room temperature, during the above vacuum vapor deposition of the hole transport layer 4 and the luminescent layer 5.

Then, the device subjected to vapor deposition of up to the luminescent layer 5, was once taken out from the above vacuum vapor deposition apparatus to the atmospheric air, and a shadow mask in a stripe shape having a width of 2 mm was intimately placed as a mask for cathode vapor deposition on the device so that it crossed the ITO stripe of the anode 2. The masked device was placed in another vacuum vapor deposition apparatus, which was evacuated in the same manner as for the organic layer until the vacuum degree in the apparatus became not higher than $2 \times 10^{-6}$ Torr (about $2.7 \times 10^{-4}$ Pa). Then, prior to formation of a cathode 7, LiF was vapor-deposited on the interface, and then aluminum in a thickness of 100 nm was formed as a cathode 7.

As described above, an organic electroluminescent device having a luminous layer portion with a size of 2 mm×2 mm, was obtained. The luminous properties of this device are shown in Table 1. As shown in Table 1, a high luminance of 32,600 cd/m² was obtained at a driving voltage of 10V with this device.

EXAMPLE 2

A device was prepared in the same manner as in Example 1 except that the above electron-accepting compound (16) was used instead of the electron-accepting compound (2) as the electron-accepting compound in the hole injection layer. The luminous properties of the device are shown in Table 1. As evident from Table 1, a high luminance at a low voltage similar to that of Example 1 was obtained.

Comparative Example 1

A device was prepared in the same manner as in Example 1 except that no hole injection layer was formed. The luminous properties of the device are shown in Table 1.

TABLE 1

|  | Maximum luminance [cd/m²] | Driving voltage [V] at maximum luminance | External quantum efficiency [%] |
| --- | --- | --- | --- |
| Example 1 | 32,600 | 9 | 2.0 |
| Example 2 | 33,000 | 9 | 1.7 |
| Comparative Example 1 | 23,000 | 10 | 1.7 |

As described above, according to the organic electroluminescent device of the present invention, wherein a layer containing a specific electron-accepting compound and a hole transport compound, is formed between a luminescent layer and an anode, a device which can be operated with a high luminous efficiency at a low voltage, which has good heat resistance, and which can maintain stable luminous properties for a long period of time, can be provided.

Accordingly, application of the organic electroluminescent device of the present invention to a flat panel display (for e.g. office automation computers or wall-mounted televisions), a light source by making use of characteristics as a plane emitter (such as a light source of a copying machine, or a backlight light source of liquid crystal displays or instruments), a display board or an identification lamp, is considered. The organic electroluminescent device of the present invention is particularly valuable technologically as an on-vehicle display device for which a high heat resistance is required.

The entire disclosure of Japanese Patent Application No. 2001-135274 filed on May 2, 2001 including specification, claims, drawings and summary are incorporated herein by reference in its entirety.

What is claimed is:

1. An organic electroluminescent device comprising a luminescent layer interposed between an anode and a cathode on a substrate, and an additional layer interposed between the luminescent layer and the anode comprising one or more electron-accepting compound(s) having a boron atom represented by the following formula (I):

wherein each of $Ar^1$ to $Ar^3$, which are independent of one another, is an aromatic carbocyclic group or an aromatic heterocyclic group, each of which may have a substituent, and one or more hole transport compound(s) or polymer(s).

2. The organic electroluminescent device according to claim 1, wherein the one or more electron-accepting compound(s) is a Lewis acid(s).

3. The organic electroluminescent device according to claim 1, wherein the one or more electron-accepting compound(s) has an electron affinity of at least 4 eV.

4. The organic electroluminescent device according to claim 1, wherein at least one of $Ar^1$ and $Ar^3$ in the formula (I) has a substituent which shows a positive value of a Hammett constant ($\sigma_m$ and/or $\sigma_p$).

5. The organic electroluminescent device according to claim 4, wherein each of $Ar^1$ and $Ar^3$ in the formula (I) has a substituent which shows a positive value of a Hammett constant ($\sigma_m$ and/or $\sigma_p$).

6. The organic electroluminescent device according to claim 1, wherein the one or more hole transport compound(s) or polymer(s) is/are aromatic tertiary amine compound(s) or compound(s) or polymer(s) having an aromatic tertiary amino group.

7. The organic electroluminescent device according to claim 6, wherein the one or more hole transport compound(s) or polymer(s) is/are compound(s) or polymer(s) having an aromatic tertiary amino group and a molecular weight of from 1,000 to 1,000,000.

8. The organic electroluminescent device according to claim 1, wherein the one or more hole transport compound(s) or polymer(s) is/are porphine derivative(s) or phthalocyanine derivative(s).

9. The organic electroluminescent device according to claim 1, wherein the one or more hole transport compound(s) or polymer(s) is/are conjugated polymer(s).

10. The organic electroluminescent device according to claim 1, wherein the content of the one or more electron-accepting compound(s) in the layer comprising the one or more electron-accepting compound(s) is within a range of from 0.1 to 50 wt %.

11. The organic electroluminescent device according to claim 1, wherein the value obtained by subtracting the electron affinity of the one or more electron-accepting compound(s) from the ionization potential of the one or more hole transport compound(s) or polymer(s) is at most 0.7 eV.

12. The organic electroluminescent device according to claim 1, wherein the one or more hole transport compound(s) or polymer(s) has a glass transition temperature of at least 85° C.

13. The organic electroluminescent device according to claim 1, wherein the one or more hole transport compound(s) or polymer(s) has a hole mobility of at least 0.0001 cm2/V·sec.

14. The organic electroluminescent device according to claim 9, wherein the conjugated polymer(s) is/are polyfluorene, polypyrrole, polyaniline, polythiophene, polyparaphenylene vinylene, or mixtures thereof.

15. The organic electroluminescent device according to claim 1, further comprising a hole transport layer.

16. The organic electroluminescent device according to claim 1, further comprising a hole transport layer and an electron transport layer.

17. The organic electroluminescent device according to claim 5, wherein the content of the one or more electron-accepting compound(s) in the layer comprising the one or more electron-accepting compound(s) is within a range of from 0.1 to 50 wt %.

18. The organic electroluminescent device according to claim 10 wherein the value obtained by subtracting the electron affinity of the one or more electron-accepting compound(s) from the ionization potential of the one or more hole transport compound(s) or polymer(s) is at most 0.7 eV.

* * * * *